(12) United States Patent
Heo et al.

(10) Patent No.: US 7,638,373 B2
(45) Date of Patent: Dec. 29, 2009

(54) METHOD OF MANUFACTURING A THIN-FILM TRANSISTOR SUBSTRATE

(75) Inventors: Seong-Kweon Heo, Suwon-si (KR); Chun-Gi You, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 12/015,822

(22) Filed: Jan. 17, 2008

(65) Prior Publication Data

US 2008/0113473 A1    May 15, 2008

(30) Foreign Application Priority Data

Mar. 8, 2006    (KR) .............................. 2007-22862

(51) Int. Cl.
*H01L 21/00* (2006.01)
(52) U.S. Cl. ..................... 438/149; 438/780; 438/781; 257/E21.026; 257/E21.414
(58) Field of Classification Search ................ 438/149, 438/780, 781; 257/E21.414, E21.026
See application file for complete search history.

(56) References Cited

U.S. PATENT DOCUMENTS 7,208,249 B2 *    4/2007    Montgomery et al. .......... 430/5

2006/0175286 A1 *    8/2006    Matsushita et al. ............ 216/23

FOREIGN PATENT DOCUMENTS

| JP | 2000-131719 | 5/2000 |
|---|---|---|
| KR | 1020020022625 | 3/2002 |
| KR | 1020020070100 | 9/2002 |

* cited by examiner

*Primary Examiner*—Charles D. Garber
*Assistant Examiner*—Stanetta D Isaac
(74) *Attorney, Agent, or Firm*—F. Chau & Associates, LLC

(57) ABSTRACT

According to a method of manufacturing a thin-film transistor (TFT) substrate, a gate insulation layer, a semiconductor layer, an ohmic contact layer, and a data metal layer are sequentially formed on a substrate. A photoresist pattern is formed in a source electrode area and a drain electrode area. A data metal layer is etched using the photoresist pattern as an etch-stop layer to form a data wire including a source electrode and a drain electrode. A photoresist pattern is reflowed to cover a channel region between a source electrode and the drain electrode. An ohmic contact layer and the semiconductor layer are etched using the reflowed photoresist pattern as an etch-stop layer to form an active pattern including an ohmic contact pattern and a semiconductor pattern. The reflowed photoresist pattern is etched back to expose a portion of the ohmic contact pattern in the channel region. The ohmic contact pattern is etched using the etched-back photoresist pattern as an etch-stop layer.

22 Claims, 20 Drawing Sheets

METHOD OF MANUFACTURING A THIN-FILM TRANSISTOR SUBSTRATE

CROSS-REFERENCE TO RELATED APPLICATIONS

This application claims priority under 35 U.S.C. § 119 to Korean Patent Application No. 2007-22862, filed on Mar. 8, 2007 in the Korean Intellectual Property Office (KIPO), the contents of which are herein incorporated by reference in their entirety.

BACKGROUND OF THE INVENTION

1. Field of the Invention

The present disclosure is directed to a method of manufacturing a thin-film transistor (TFT) substrate, and more particularly, to a method of manufacturing a TFT substrate used for a display device.

2. Description of the Related Art

A liquid crystal display apparatus displaying an image generally includes a thin-film transistor (TFT) substrate having a TFT and a pixel electrode, a color filter substrate having a color filter and a common electrode, and a liquid crystal layer disposed between the TFT substrate and the color filter substrate.

The TFT substrate is manufactured through a photo etching process using a mask. Therefore, to reduce manufacturing costs and improve productivity, the number of processes using the mask can be reduced.

Recently, a four-mask process, through which an active pattern and a data wire are simultaneously patterned using a mask, has been developed. In the four-mask process, a slit mask or a halftone mask is used to form a stepped portion on a surface of a photoresist pattern, and the active pattern and the data wire are simultaneously patterned through a combination of an etching process and an ashing process.

However, the manufacturing cost for the mask is increased in the four-mask process. In addition, the number of processes for manufacturing a TFT substrate may be increased in the four-mask process even though the number of photo processes may be reduced. Since the four-mask process includes an under exposure process, uniformity may be decreased and a precise design may be difficult to manufacture.

SUMMARY OF THE INVENTION

Embodiments of the present invention provide a method of manufacturing a thin-film transistor (TFT) substrate capable of reducing the number of processes for manufacturing a TFT substrate even though masks are unchanged.

In a method of manufacturing a TFT substrate according to an exemplary embodiment of the present invention, a gate insulation layer, a semiconductor layer, an ohmic contact layer, and a data metal layer are sequentially formed on a substrate having a gate wire formed thereon. A photoresist pattern is formed in a source electrode area and a drain electrode area. The data metal layer is etched using the photoresist pattern as an etch-stop layer to form a data wire including a source electrode and a drain electrode. The photoresist pattern is reflowed to cover a channel region between the source electrode and the drain electrode. The ohmic contact layer and the semiconductor layer are etched using the reflowed photoresist pattern as an etch-stop layer to form an active pattern including an ohmic contact pattern and a semiconductor pattern. The reflowed photoresist pattern is etched back to expose a portion of the ohmic contact pattern in the channel region. The ohmic contact pattern is etched using the etched-back photoresist pattern as an etch-stop layer, completing the TFT having a channel.

The photoresist pattern may include a novolak resin or an acrylic resin. In addition, the photoresist pattern may include a binder having a degree of dispersion of about 1.5 to about 2. The photoresist pattern may be reflowed at a temperature range of about 150° C. to about 160° C.

The method of manufacturing a TFT may further include a step of stripping the etched-back photoresist pattern, a step of forming an overcoat layer on the substrate having the data wire formed thereon, and a step of forming a pixel electrode electrically connected to the drain electrode on the overcoat layer.

In addition, the method of manufacturing a TFT may further include a step of forming a storage capacitor. To form the storage capacitor, a lower storage electrode spaced apart from the gate wire is simultaneously formed when the data wire is formed, and an upper storage electrode overlapping with the lower storage electrode is simultaneously formed when the data wire is formed.

In a method of manufacturing a TFT substrate according to another exemplary embodiment of the present invention, a gate insulation layer, a semiconductor layer, an ohmic contact layer are sequentially formed on a substrate having a gate wire and a gate metal pad formed thereon. A contact hole passing through the gate insulation layer, the semiconductor layer and the ohmic contact layer is formed to expose the gate metal pad. A data metal layer is formed on the substrate having the contact hole. A photoresist pattern is formed in a source electrode region, a drain electrode region and a pad region. The data metal layer is etched using the photoresist pattern as an etch-stop layer to form a data wire including a source electrode and the drain electrode and a data metal pad directly connected to the gate metal pad. The photoresist pattern is reflowed to cover a channel region between the source electrode and the drain electrode. The ohmic contact layer and the semiconductor layer are etched using the reflowed photoresist pattern as an etch-stop layer to form an active pattern including an ohmic contact pattern and a semiconductor pattern. The reflowed photoresist pattern is etched back to expose a portion of the ohmic contact pattern in the channel region. The ohmic contact pattern is etched using the etched-back photoresist pattern as an etch-stop layer completing the TFT having a channel.

According to the method of manufacturing a TFT substrate, the number of processes for manufacturing the TFT using a mask may be reduced. Therefore, manufacturing costs may be decreased and productivity may be improved.

BRIEF DESCRIPTION OF THE DRAWINGS

The above and other features of embodiments of the present invention will become more apparent by describing in detailed exemplary embodiments thereof with reference to the accompanying drawings.

DESCRIPTION OF EXEMPLARY EMBODIMENTS

Embodiments of the invention are described more fully hereinafter with reference to the accompanying drawings, in which exemplary embodiments of the invention are shown. This invention may, however, be embodied in many different forms and should not be construed as limited to the embodiments set forth herein. It will be understood that when an element or layer is referred to as being "on," "connected to" or "coupled to" another element or layer, it can be directly on, connected or coupled to the other element or layer or intervening elements or layers may be present. Like numbers refer to like elements throughout.

Hereinafter, the present invention will be explained in detail with reference to the accompanying drawings.

Figure 1:
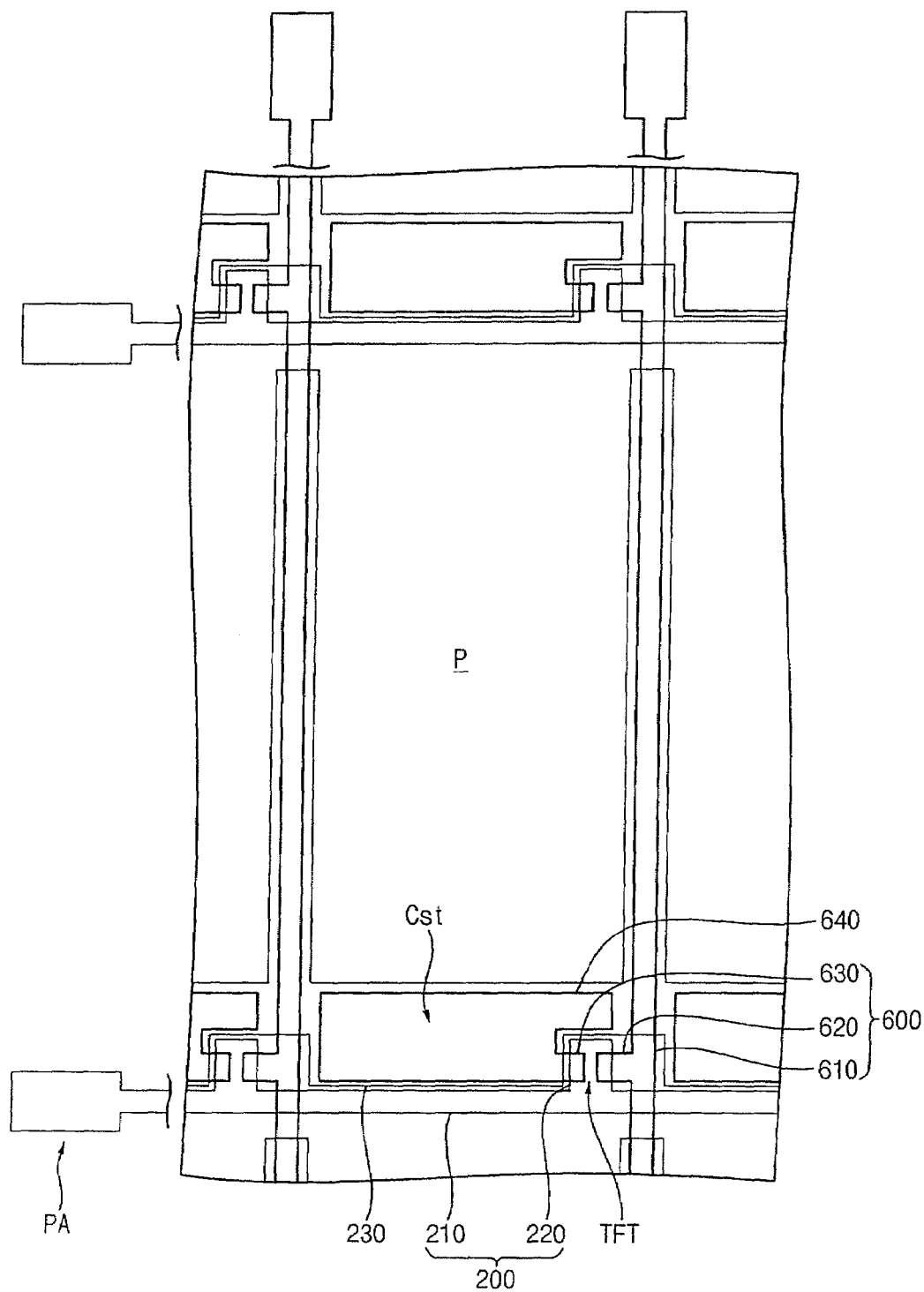
FIG. 1 is a plan view illustrating a thin-film transistor (TFT) substrate according to an exemplary embodiment of the present invention.
Figure 2:
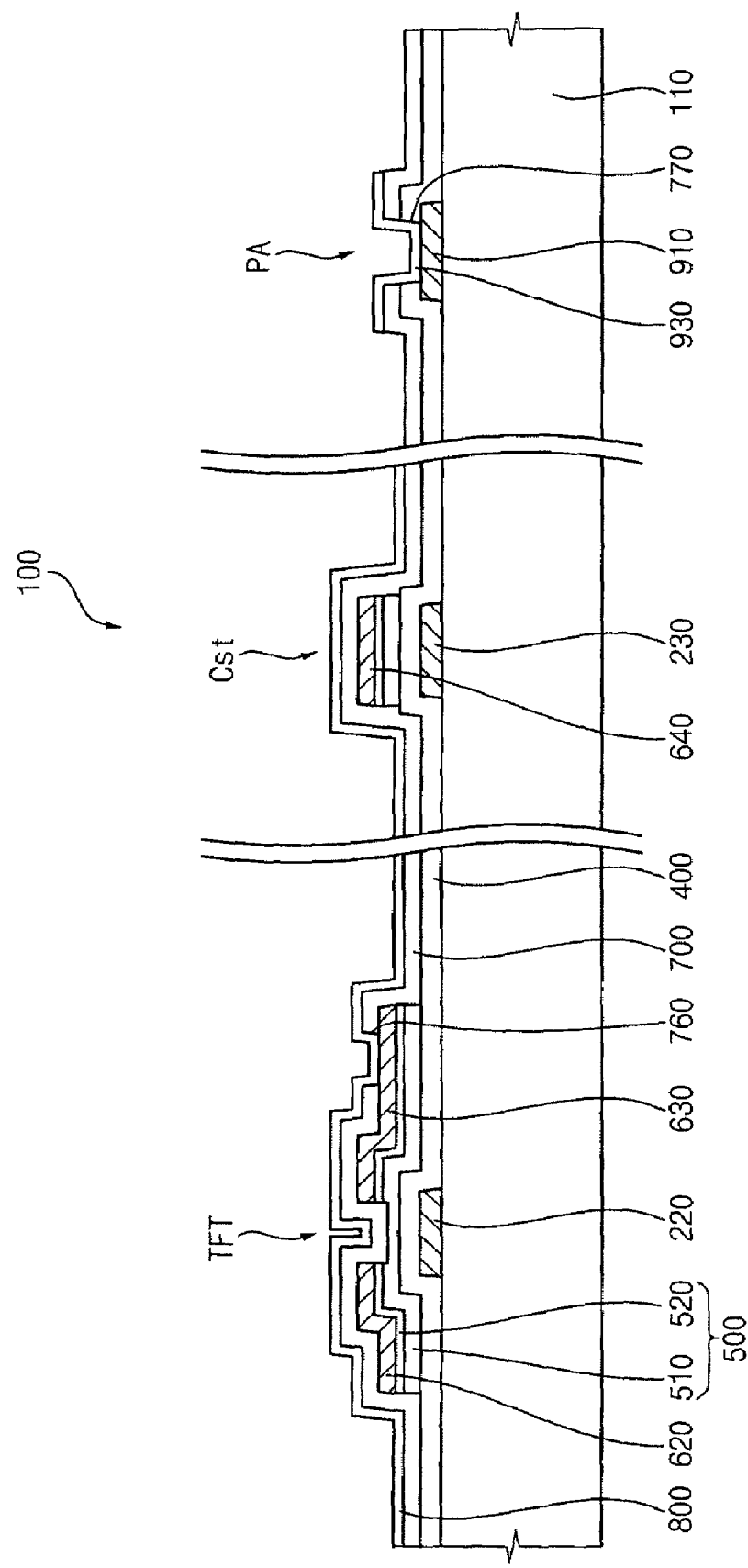
FIG. 2 is a cross-sectional view a TFT, a storage capacitor and a pad shown in FIG. 1.

FIG. 1 is a plan view illustrating a thin-film transistor (TFT) substrate according to an exemplary embodiment of the present invention. FIG. 2 is a cross-sectional view a TFT, a storage capacitor and a pad shown in FIG. 1.

Referring to FIGS. 1 and 2, a TFT 100 according to an exemplary embodiment of the present invention includes a gate wire 200, a gate insulation layer 400, an active pattern 500, and a data wire 600.

The gate wire 200 is formed on a substrate 110 and includes a gate line 210 and a gate electrode 220.

The substrate 110 is formed using a transparent conductive material. For example, the transparent conductive material may include glass or plastic.

For example, the gate line 210 is extended in a first direction.

The gate electrode 220 is connected to the gate line 210. The gate electrode 220 is a gate terminal of a TFT formed in a pixel P.

Examples of a conductive material that may be used for the gate wire 200 include aluminum (Al), molybdenum (Mo), neodymium (Nd), chromium (Cr), tantalum (Ta), titanium (Ti), tungsten (W), copper (Cu), silver (Ag), etc. These may be used alone or in a combination thereof. The gate wire 200 may include at least two metal layers having different physical properties from each other. For example, the gate wire 200 may include an aluminum layer and a molybdenum layer formed on the aluminum layer to lower the resistance. That is, the gate wire 200 may have an Al/Mo double-layered structure.

The gate insulation layer 400 is formed on the substrate 110 having the gate wire 200 formed thereon. The gate insulation layer 400 protects the gate wire 200 and the gate wire 200 is insulated by the gate insulation layer 400. For example, the gate insulation layer 400 may include silicon nitride (SiNx) or silicon oxide (SiOx). The gate insulation layer 400 may have a thickness of about 4,000 Å to about 4,500 Å.

The active pattern 500 is formed on the gate insulation layer 400 to cover the gate electrode 220. The active pattern 500 may include a semiconductor layer 510 and an ohmic contact layer 520. For example, the semiconductor layer 510 may include amorphous silicon (a-Si) and the ohmic contact layer 520 may include amorphous silicon doped with n+ ions at a high concentration (n+ a-Si).

The data wire 600 is formed on the substrate 110 having the gate insulation layer 400 and the active pattern 500 formed thereon. The data wire 600 includes a data line 610, a source electrode 620 and a drain electrode 630.

The data line 610 is extended in a second direction different from the first direction to cross the gate line 210.

The source electrode 620 and the drain electrode 630 are spaced apart from each other to form a channel of the TFT. The source electrode 620 is connected to the data line 610. The source electrode 620 is a source terminal of the TFT. The drain electrode 630 is a drain terminal of the TFT.

The data wire 600 may include aluminum (Al), molybdenum (Mo), neodymium (Nd), chromium (Cr), tantalum (Ta), titanium (Ti), tungsten (W), copper (Cu), silver (Ag), etc. These may be used alone or in a combination thereof. The data wire 600 may include at least two metal layers having different physical properties from each other. For example, the data wire 600 may include a molybdenum layer, an aluminum layer and a molybdenum layer, which are sequentially stacked on the substrate 110, to lower the resistance. That is, the data wire 600 may have a Mo/Al/Mo triple-layered structure.

The TFT substrate 100 may further include an overcoat layer 700 formed on the substrate 110 having the data wire 600 formed thereon. The overcoat layer 700 protects the TFT and the TFT is insulated by the overcoat layer 700. The overcoat layer may include silicon nitride (SiNx) or silicon oxide (SiOx). The overcoat layer 700 may have a thickness of about 1,500 Å to about 2,000 Å.

The TFT substrate 100 may further include an organic layer (not shown) formed on the overcoat layer 700. The organic layer is formed on the overcoat layer 700 to flatten the TFT substrate 100.

The TFT 100 may further include a pixel electrode 800 formed on the overcoat layer 700 corresponding to the pixel P. The pixel electrode 800 includes a transparent conductive material to transmit light. Examples of a transparent conductive material that may be used for the pixel electrode 800 include indium zinc oxide (IZO) or indium tin oxide (ITO).

The pixel electrode 800 is electrically connected to the drain electrode 630 through a contact hole 760 passing through the overcoat layer 700.

The TFT applies a data voltage received through the data line 610 to the pixel electrode 800 in response to a gate voltage received through the gate line 210.

The TFT substrate 100 may further include a storage capacitor Cst to maintain the data voltage applied to the pixel electrode 800 uniform for a frame.

The storage capacitor Cst may include a lower storage electrode 230 and an upper storage electrode 640 between which the gate insulating layer 400 and the active pattern 500 are disposed.

The lower storage electrode 230 may be formed from the same layer as the gate wire 200. The lower storage electrode 230 is insulated from the gate line 210 and the gate electrode 220. The lower storage electrode 230 is a lower terminal of the storage capacitor Cst formed in the pixel P. The lower storage electrode 230 may overlap with the upper storage electrode 640 and the data line 610 to increase an electrostatic capacitance of the storage capacitor Cst. For example, a common voltage Vcom may be applied to the lower storage electrode 230.

The upper storage electrode 640 may be formed from the same layer as the data wire 600. The upper storage electrode 640 is connected to the drain electrode of the TFT and overlaps with the lower storage electrode 230. The upper storage electrode 640 is an upper terminal of the storage capacitor Cst formed in the pixel P.

Alternatively, the storage capacitor may have the lower storage electrode 230 as the lower terminal and the pixel electrode 800 as the upper terminal without the upper storage electrode 640.

The TFT substrate 100 may further include a pad PA connected to a driving chip for driving the TFT substrate 100.

The pad PA may include a gate metal pad 910 and a pad electrode 930. The gate metal pad 910 is formed from the same layer as the gate wire 200. The pad electrode 930 is formed from the same layer as the pixel electrode 800. The pad electrode 930 is connected to the gate metal pad 910 through a contact hole 770 passing through the gate insulation layer 400 and the overcoat layer 700.

Alternatively, the pad PA may include a data metal pad and a pad electrode. The data metal pad is disposed on the gate insulation layer 400 and is formed from the same layer as the data wire 600. The pad electrode is formed from the same layer as the pixel electrode 800 and connected to the data metal pad through a contact hole passing through the overcoat layer 700.

Figure 3:
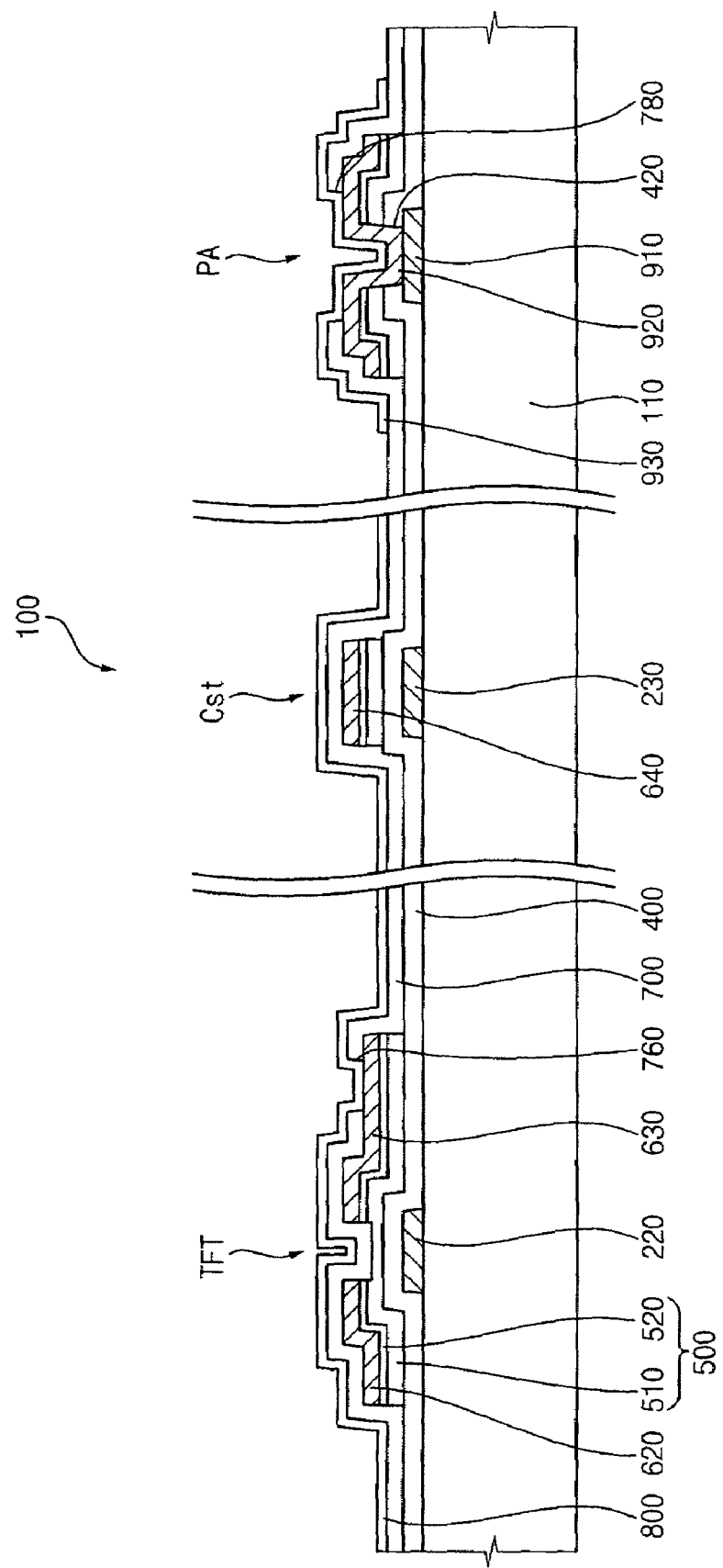
FIG. 3 is a cross-sectional view illustrating a TFT substrate according to another exemplary embodiment of the present invention.

FIG. 3 is a cross-sectional view illustrating a TFT substrate according to another exemplary embodiment of the present invention. In FIG. 3, elements except for the pad are substantially the same as those shown in FIG. 2. Thus, any repetitive explanation will be omitted.

Referring to FIG. 3, the pad PA may include a gate metal pad 910 and a data metal pad 920. The gate metal pad 910 is formed from the same layer as the gate wire 200. The data metal pad 920 is formed from the same layer as the data wire 600.

The data metal pad 920 makes direct contact with the gate metal pad 910 through a contact hole 420 passing through the gate insulation layer 400 and the active pattern 500. When the data metal pad 920 makes direct contact with the gate metal pad 910, contact properties of the pad PA may be improved.

The pad PA may further include a pad electrode 930 formed from the same layer as the pixel electrode 800. The pad electrode 930 is connected to the data metal pad 920 through a contact hole 780 passing through the overcoat layer 700.

Hereinafter, methods of manufacturing a TFT substrate according to exemplary embodiments of the present invention will be explained.

FIGS. 4 to 11 are cross-sectional views illustrating processes for manufacturing the TFT according to an embodiment shown in FIGS. 1 and 2.

Figure 4:
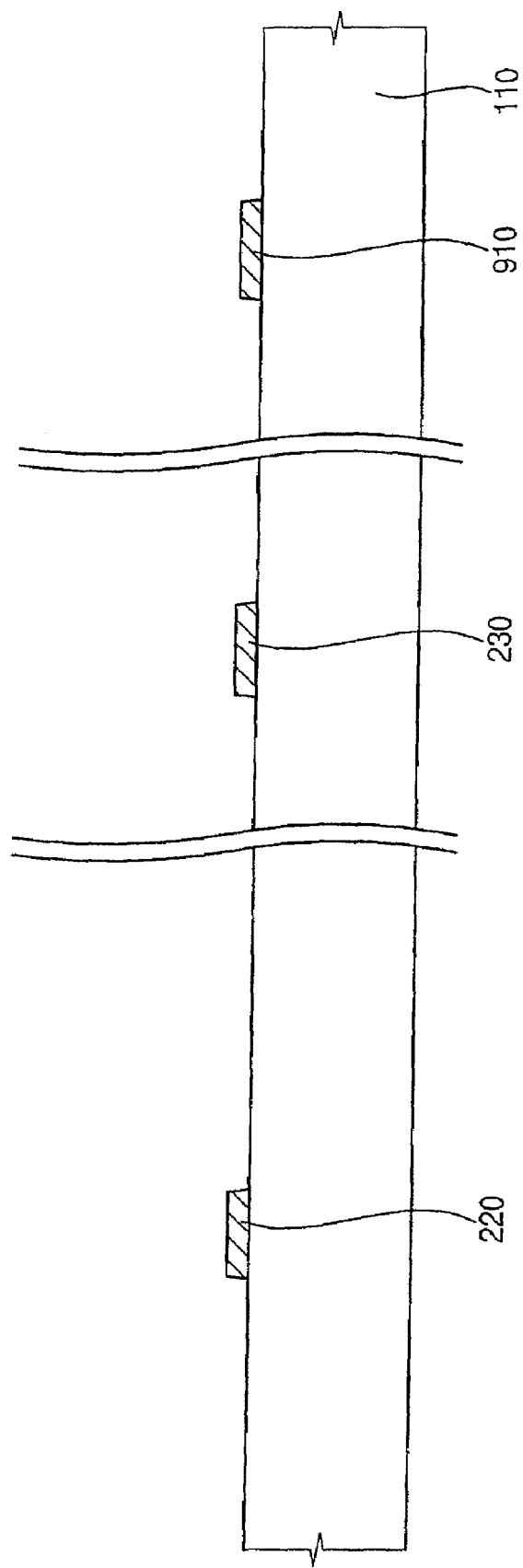
FIGS. 4 to 11 are cross-sectional views illustrating processes for manufacturing the TFT shown in FIGS. 1 and 2.

Referring to FIGS. 1 and 4, a gate metal layer is formed on a substrate 110, and the gate metal layer is patterned through a photo etching process to form a gate wire 200 including a gate line 210 and a gate electrode 220. For example, the gate metal layer may be formed on the substrate 110 through a sputtering process. The photo etching process may include a wet etching process.

Examples of a material that may be used for the gate metal layer include aluminum (Al), molybdenum (Mo), neodymium (Nd), chromium (Cr), tantalum (Ta), titanium (Ti), tungsten (W), copper (Cu), silver (Ag), etc. These may be used alone or in a combination thereof. The gate metal layer may include at least two metal layers having different physical properties from each other. For example, the gate metal layer may include an aluminum layer and a molybdenum layer, which are sequentially stacked on the substrate 110, to lower the resistance. That is, the data wire 600 may have an Al/Mo double-layered structure.

The gate metal layer is patterned to form not only the gate line 200 but also a lower storage electrode 230. The lower storage electrode 230 is formed in a storage capacitor region and spaced apart from the gate line 200. In addition, the gate metal layer may be patterned to form a gate metal pad 910. The gate metal pad 910 is formed in a pad region PA.

Figure 5:
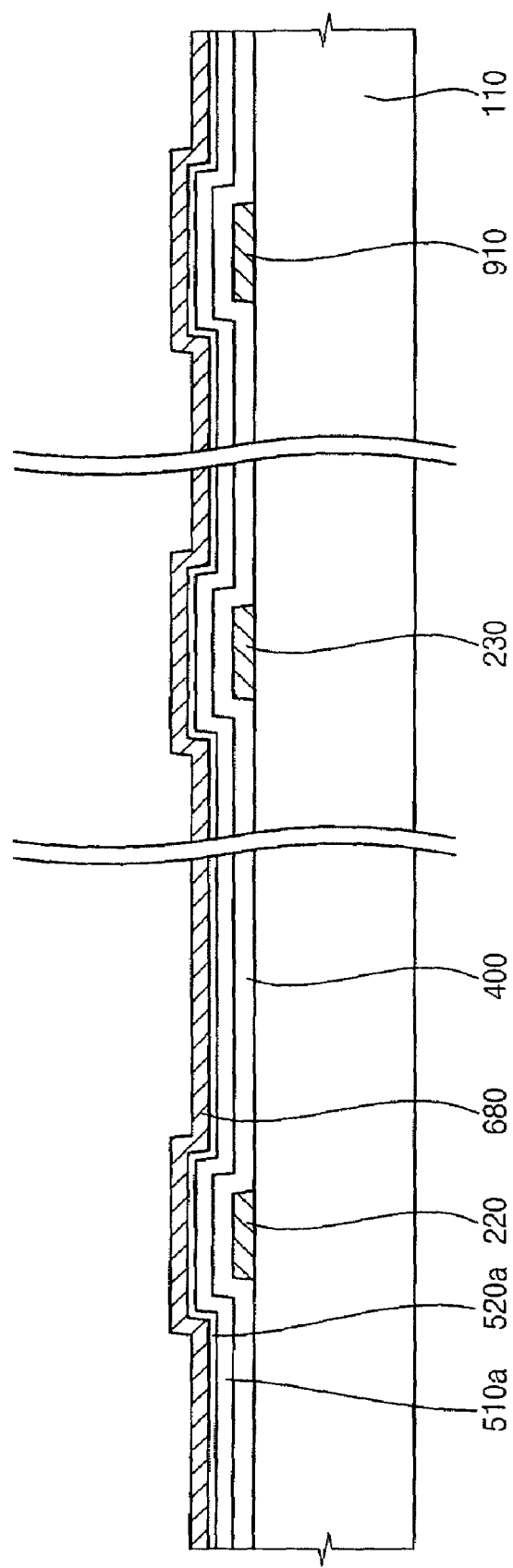

Referring to FIGS. 1 and 5, a gate insulation layer 400, a semiconductor layer 510a, an ohmic contact layer 520a, and a data metal layer 680 are sequentially formed on the substrate 110 having the gate wire 200, the lower storage electrode 230 and the gate metal pad 910 formed thereon.

For example, the gate insulation layer 400 may include silicon nitride (SiNx), the semiconductor layer 510a may include amorphous silicon (a-Si), and the ohmic contact layer 520a may include amorphous silicon doped with n+ ions at a high concentration (n+ a-Si). The gate insulation layer 400, the semiconductor layer 510a and the ohmic contact layer 520a may be sequentially formed through a chemical vapor deposition (CVD) process.

Examples of a material that may be used for the data metal layer 680 include aluminum (Al), molybdenum (Mo), neodymium (Nd), chromium (Cr), tantalum (Ta), titanium (Ti), tungsten (W), copper (Cu), silver (Ag), etc. These may be used alone or in a combination thereof. The data metal layer 680 may include at least two metal layers having different physical properties from each other. For example, the data metal layer 680 may include a molybdenum layer, an aluminum layer and a molybdenum layer, which are sequentially stacked on the substrate 110, to lower the resistance. That is, the data metal layer 680 may have a Mo/Al/Mo triple-layered structure. For example, the data metal layer 680 may be formed on the ohmic contact layer 520a through a sputtering process.

Figure 6:
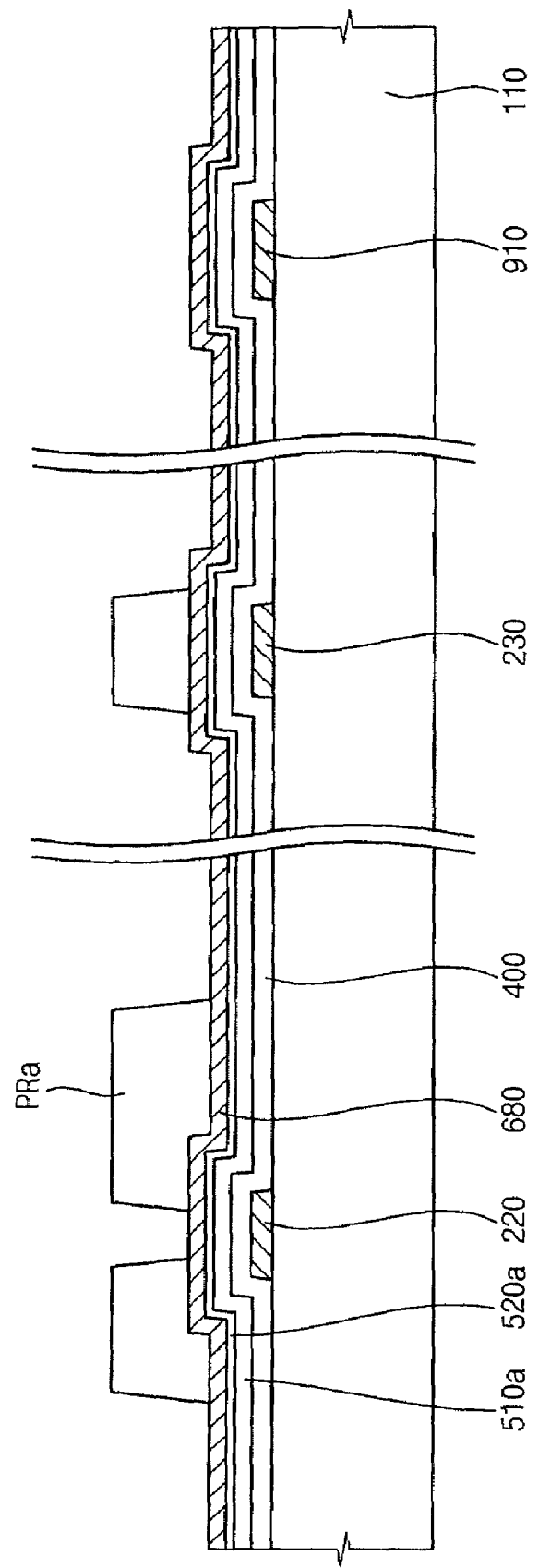

Referring to FIGS. 1 and 6, a photoresist film is formed on the data metal layer 680, and the photoresist layer is patterned to form a photoresist pattern PRa.

The photoresist film may include a positive photoresist material. A portion of the positive photoresist material exposed to light is removed by a developing solution. The photoresist film may include a material reflowed in a predetermined temperature range. For example, the photoresist film may include novolak resin or acrylic resin to which binders having a degree of dispersion of about 1.5 to about 2 are added to be reflowed in a predetermined temperature range. For example, the predetermined temperature range may be about 150° C. to about 160° C.

Examples of an organic material that may be used as the photoresist film include novolak resin, acrylic resin, olefin resin, etc. Thermal reflow properties of the photoresist layer are determined by additives such as the binders. For example, when a degree of dispersion of a material to which no additive is added is set as 1, a degree of dispersion of the binders added to the acrylic resin is about 3, a degree of dispersion of the binders added to the novolak resin is about 5 to about 6, and a degree of dispersion of the binders added to the olefin resin is about 1.5 to about 2. Therefore, a reflow is generated in a large temperature range when the photoresist film includes the acrylic resin or the novolak resin, and the reflow is generated in a temperature range smaller than the flow temperature range of the acrylic resin and the novolak resin when the photoresist layer includes the olefin resin. However, when a general positive photoresist material includes the olefin resin, an exposure energy level becomes high where productivity is lowered. The photoresist film can be hardened by a heat treatment for the reflow to prevent stripping the photoresist layer. Therefore, when binders having the degree of dispersion of about 1.5 to about 2, which is lower than conventional binders, are added to the novolak resin or the acryl resin, which are more transparent and stronger than the olefin resin, the reflow properties of the photoresist film may be improved.

The photoresist pattern PRa formed through patterning the photoresist film is formed in an area in which the data wire 600 including a source electrode 620 and a drain electrode 630 is formed. In addition, the photoresist pattern PRa may be formed in an area in which an upper storage electrode 640 is formed.

Figure 7:
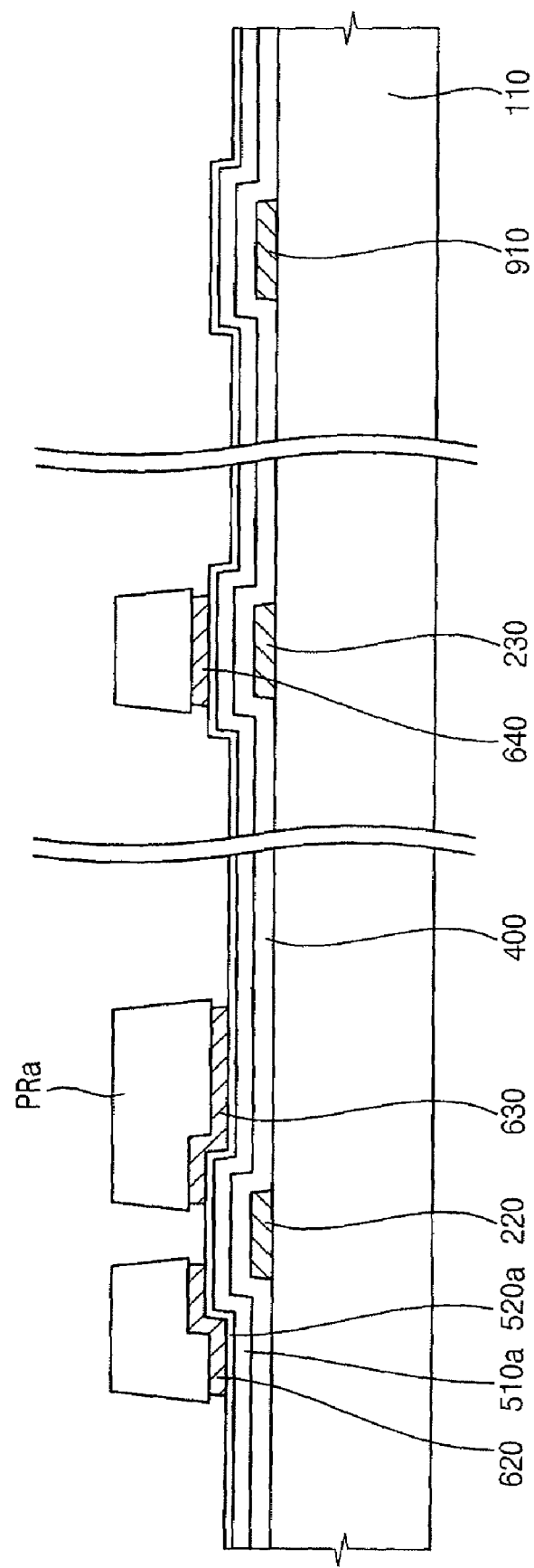

Referring to FIGS. 1 and 7, the data metal layer 680 is etched to form a data wire 600 including a data line 610, a source electrode 620 and a drain electrode 630. When the data metal layer 680 is etched, the photoresist pattern PRa is used as an etch-stop layer. In addition, the data metal layer 680 is etched to form not only the data wire 600 but also an upper storage electrode 640.

Figure 8:
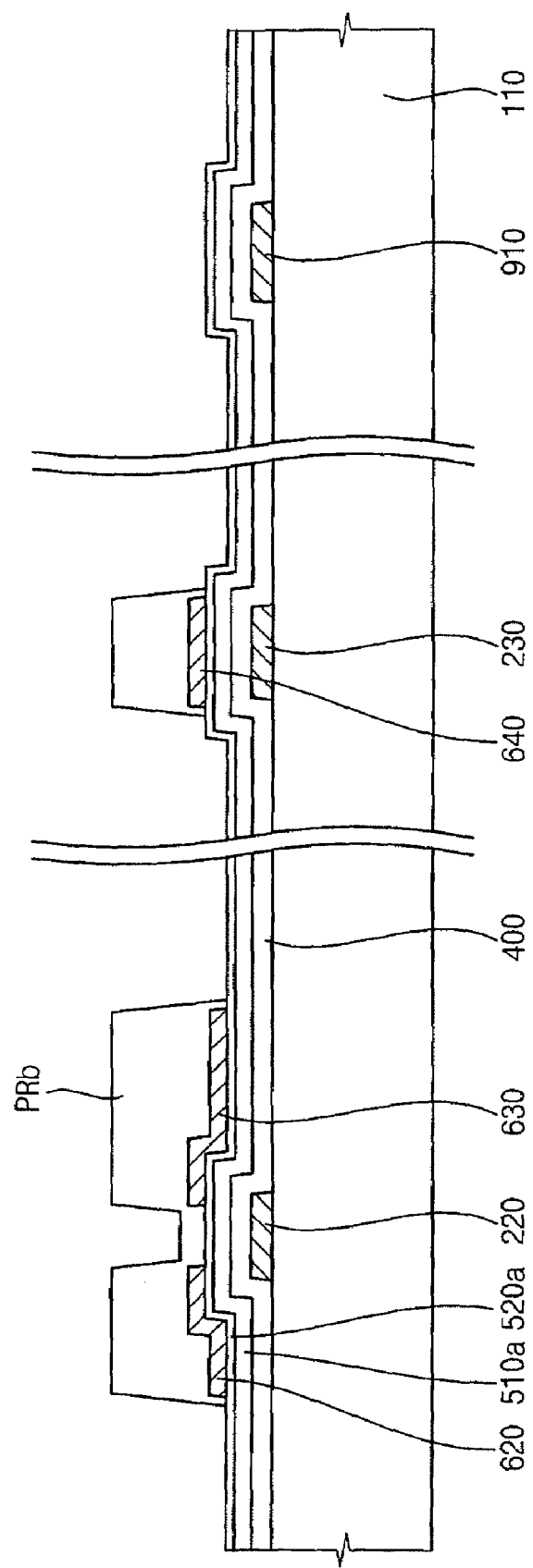

Referring to FIG. 8, the photoresist pattern PRa is reflowed forming a reflowed photoresist pattern PRb to cover a channel region between the source electrode 620 and the drain electrode 630. The reflow process is performed at a temperature of more than about 140° C. For example, the reflow process may be performed at a temperature of about 150° C. to about 160° C.

Figure 9:
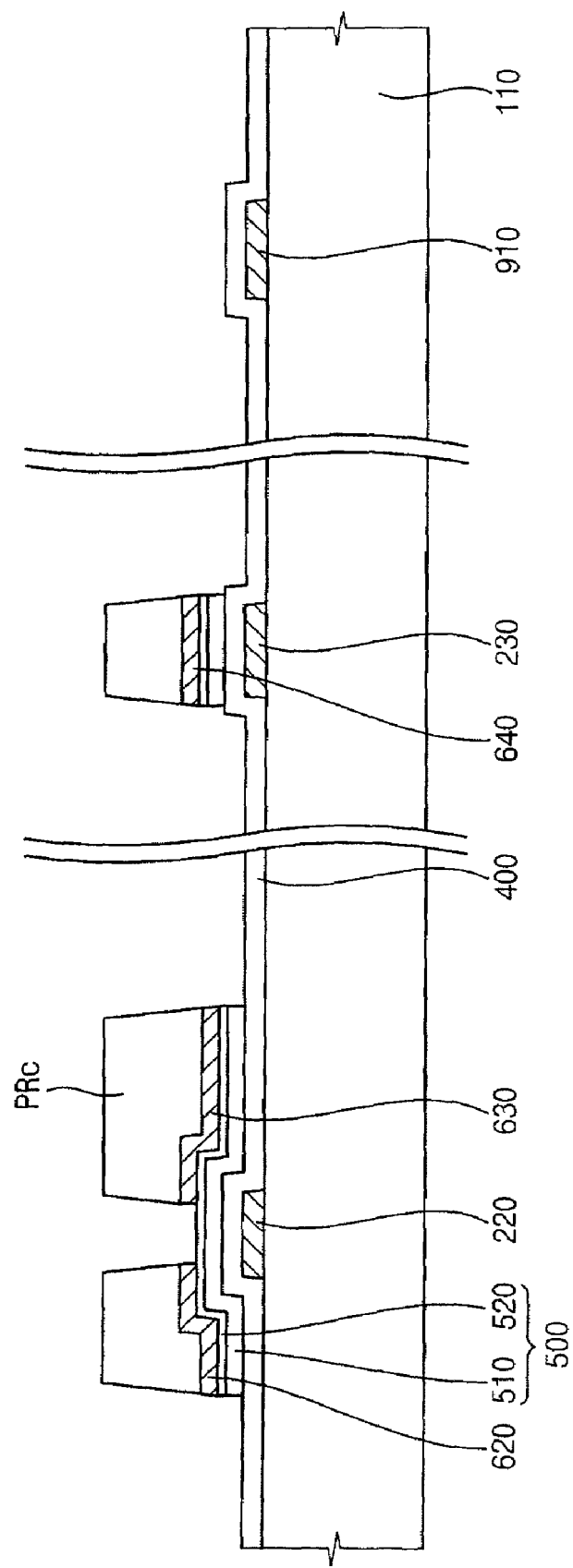
Figure 10:
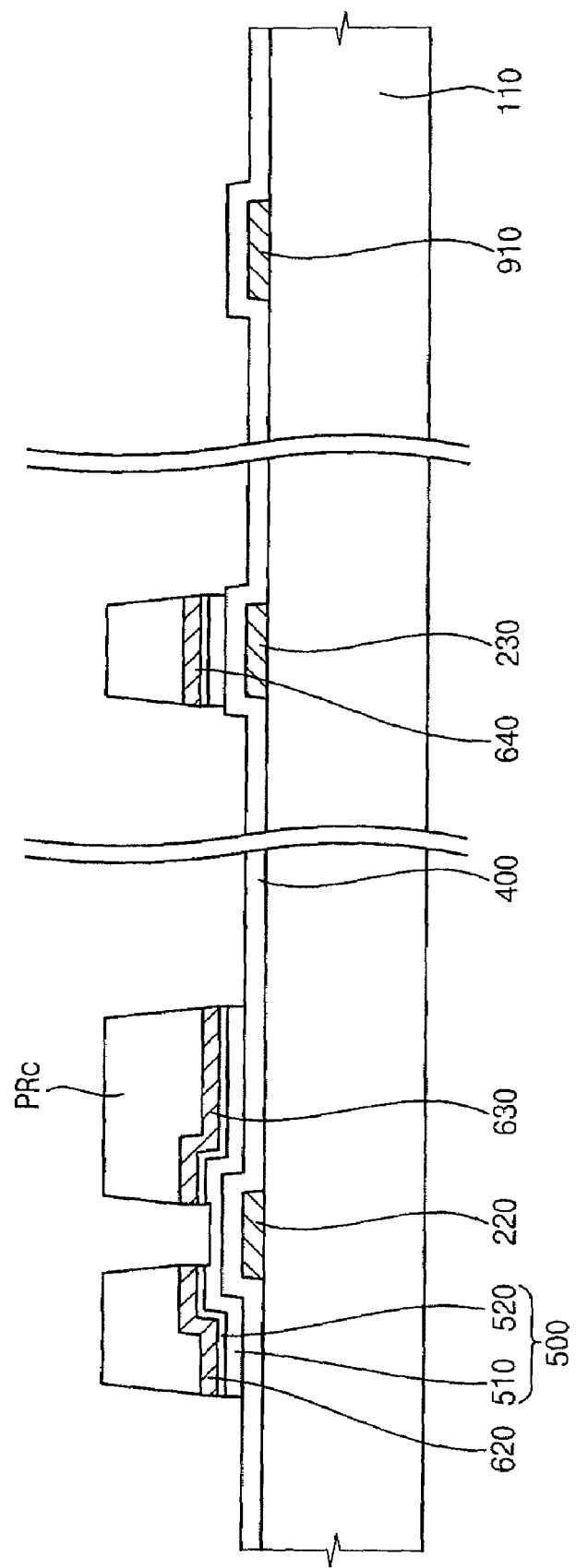

Referring to FIGS. 9 and 10, the ohmic contact layer 520a and the semiconductor layer 510a are etched to form an active pattern 500 including an ohmic contact pattern and a semiconductor patter. When the ohmic contact layer 520a and the semiconductor layer 510a are etched, the reflowed photoresist pattern PRb is used as an etch-stop layer.

An etch-back process that decreases a thickness of the reflowed photoresist pattern PRb by a predetermined thickness is performed forming photoresist pattern PRc. A portion of the ohmic contact layer 520a in the channel region between the source electrode 620 and the drain electrode 630 is exposed through the etch-back process.

Referring to FIG. 10, the ohmic contact layer 520a is etched to expose a portion of the semiconductor layer 520a between the source electrode 620 and the drain electrode 630. A TFT having a channel is completed. When the ohmic contact layer 520a is etched, the photoresist pattern PRc processed through the etch-back process is used as an etch-stop layer.

Since the process of forming the active pattern 500, the etch-back process of the photoresist pattern PRb, and the etching process of the ohmic contact layer 520a corresponding to the channel region all include a dry etching process, the above-mentioned processes may be sequentially performed to reduce the number of processes of manufacturing a TFT substrate by optimizing processing conditions of the etch-back process of the photoresist pattern PRb.

A portion of the photoresist pattern PRc remaining on the source electrode 620, the drain electrode 630 and the upper storage electrode 640 is stripped to complete the TFT.

Figure 11:
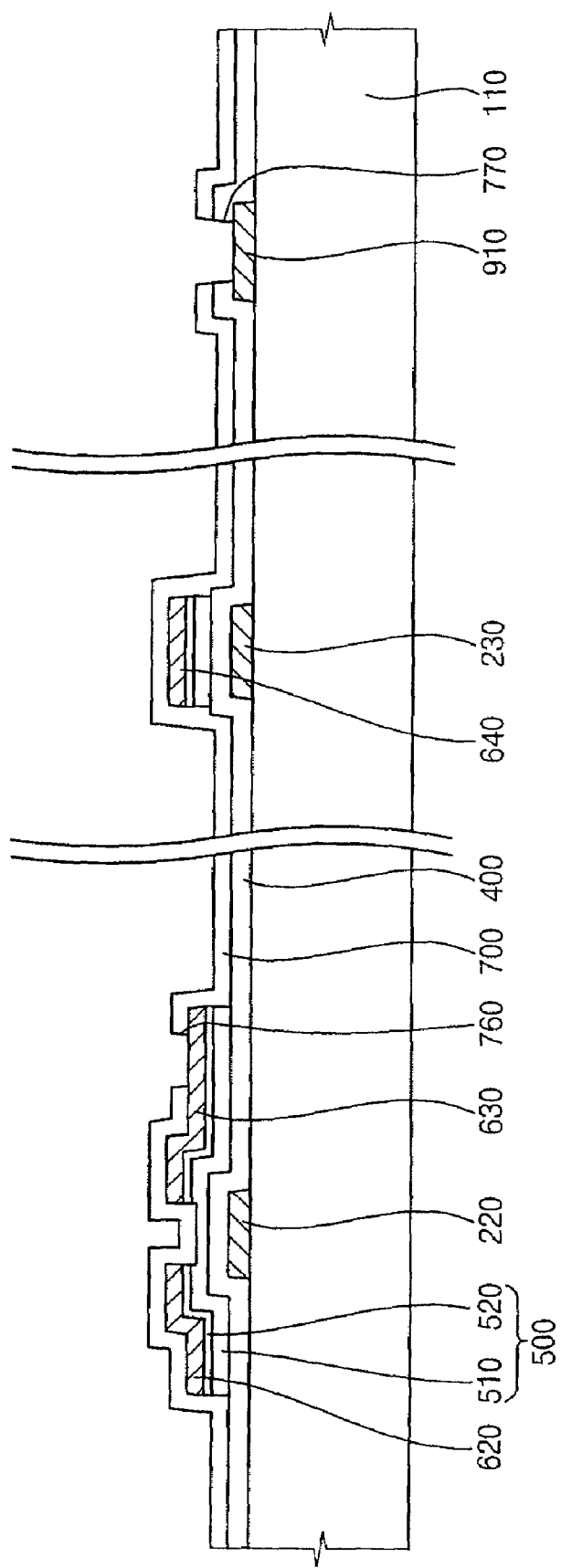

Referring to FIGS. 1 and 11, an overcoat layer 700 is formed on the substrate 110 having the data wire 600 formed thereon. The overcoat layer 700 protects the data wire 600 and the data wire 600 is insulated by the overcoat layer 700. The overcoat layer 700 may include silicon nitride (SiNx).

An organic layer (not shown) may be formed on the overcoat layer 700 to flatten the TFT substrate 100.

The overcoat layer 700 is patterned through a photo etching process to form a contact hole 760 exposing a portion of the drain electrode 630. In addition, the overcoat layer 700 may be patterned to form a contact hole 770 exposing a portion of the gate metal pad 910 of the pad PA.

Referring to FIG. 2, a pixel electrode 800 is formed on the overcoat layer 700. The pixel electrode 800 is electrically connected to the drain electrode 630 through the contact hole 760 formed through the overcoat layer 700.

In addition, a pad electrode 930 may be also formed in a pad PA region when the pixel electrode 800 is formed on the overcoat layer 700. The pad electrode 930 makes direct contact with the gate metal pad 910 through the contact hole 770 formed through the overcoat layer 700 and the gate insulation layer 400.

FIGS. 12 to 20 are cross-sectional views illustrating processes for manufacturing the TFT substrate according to the embodiment shown in FIG. 3.

Figure 12:
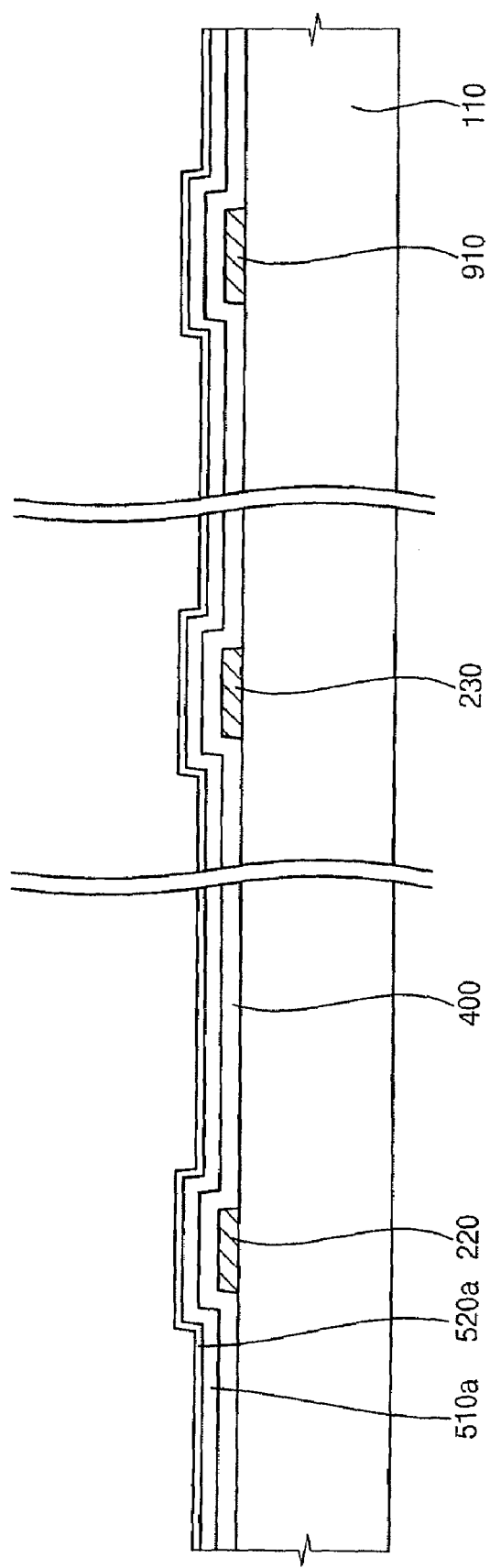
FIGS. 12 to 20 are cross-sectional views illustrating processes for manufacturing the TFT substrate shown in FIG. 3.

Referring to FIGS. 1 and 12, a gate wire 200 including a gate line 210 and a gate electrode 220, a lower storage electrode 230 and a gate metal pad 910 are formed on a substrate 110.

A gate insulation layer 400, a semiconductor layer 510a and an ohmic contact layer 520a are sequentially formed on the substrate 110 having the gate wire 200, the lower storage electrode 230 and the gate metal pad 910 formed thereon.

Figure 13:
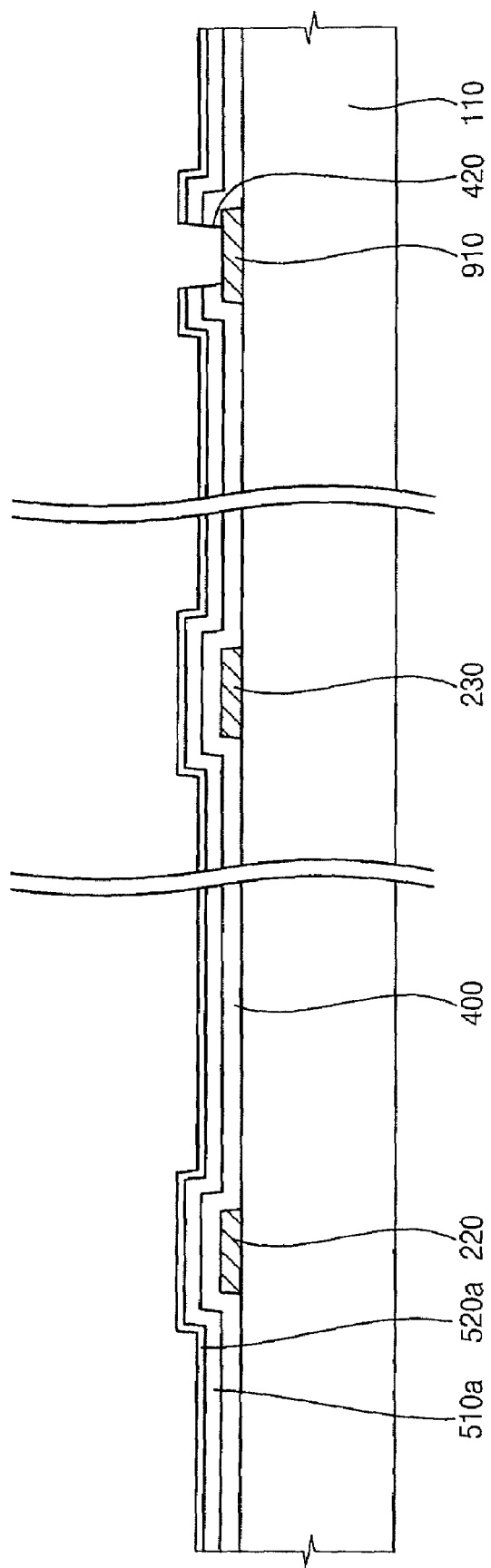

Referring to FIG. 13, the gate insulation layer 400, the semiconductor layer 510a and the ohmic contact layer 520a are patterned through a photo etching process to form a contact hole 420 exposing the gate metal pad 910.

Figure 14:
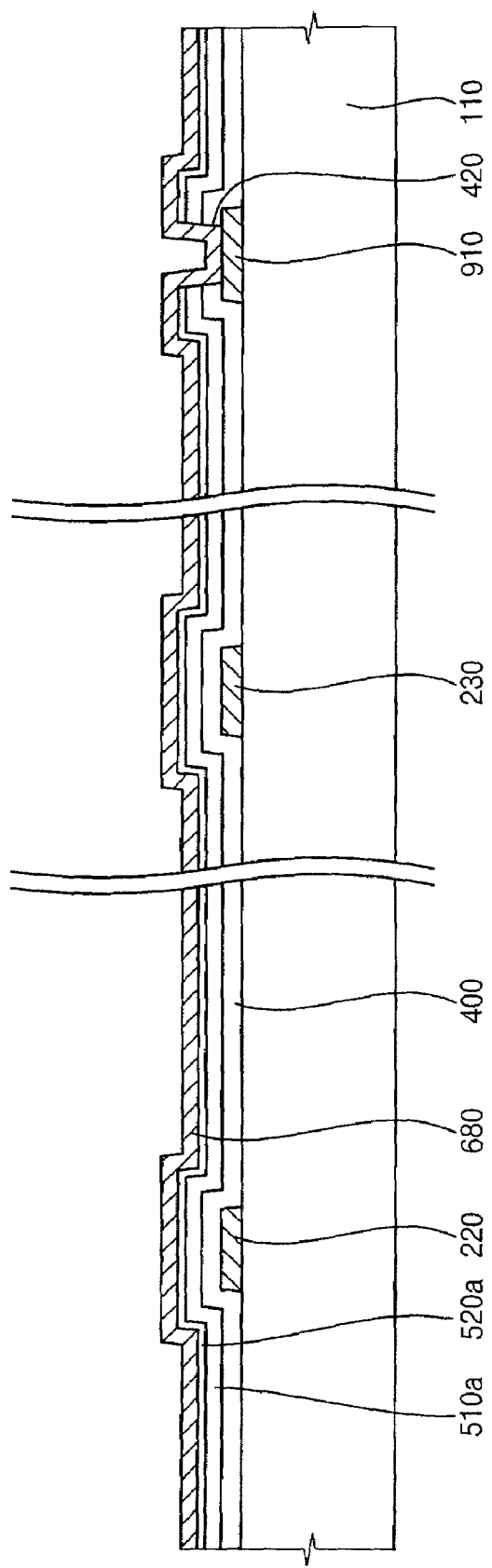

Referring to FIG. 14, a data metal layer 680 is formed on the substrate 110 having the contact hole 420. The data metal layer 680 makes direct contact with the gate metal pad 910 through the contact hole 420.

Figure 15:
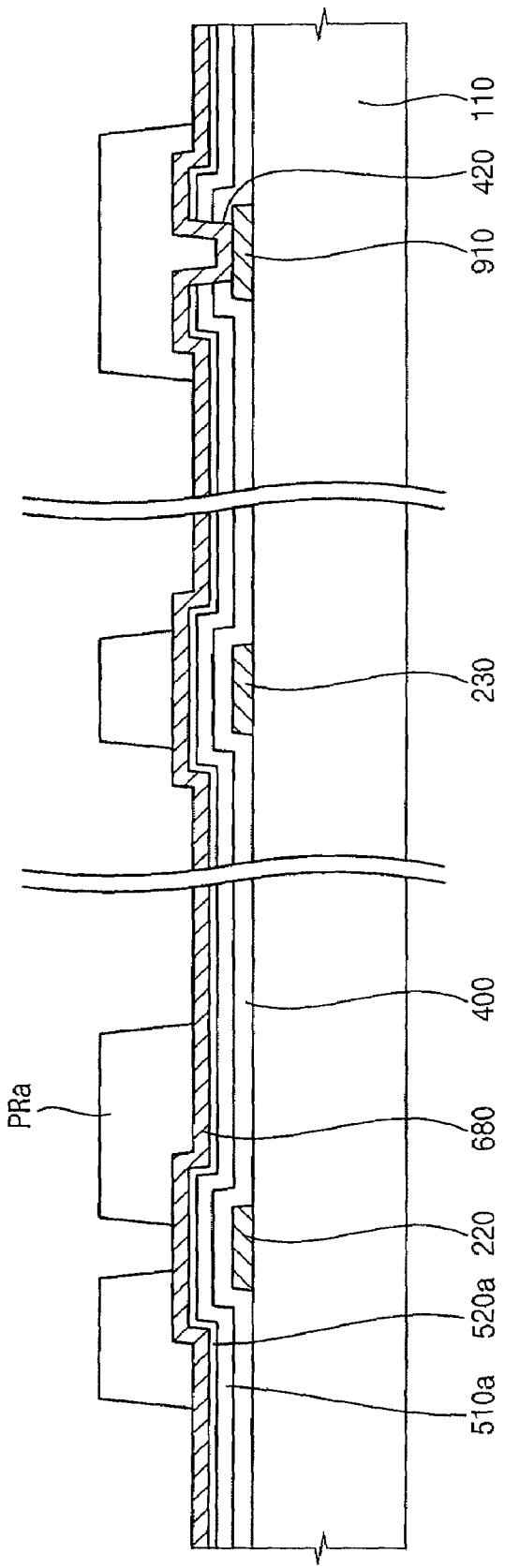

Referring to FIGS. 3 and 15, a photoresist film is formed on the data metal layer 680 and the photoresist film is patterned through a photo etching process to form a photoresist pattern PRa.

The photoresist pattern PRa formed through patterning the photoresist film is formed in an area in which a data wire 600 including a source electrode 620 and a drain electrode 630 is formed. In addition, the photoresist pattern PRa may be formed in areas in which an upper storage electrode 640 and a data metal pad 920 are respectively formed.

Figure 16:
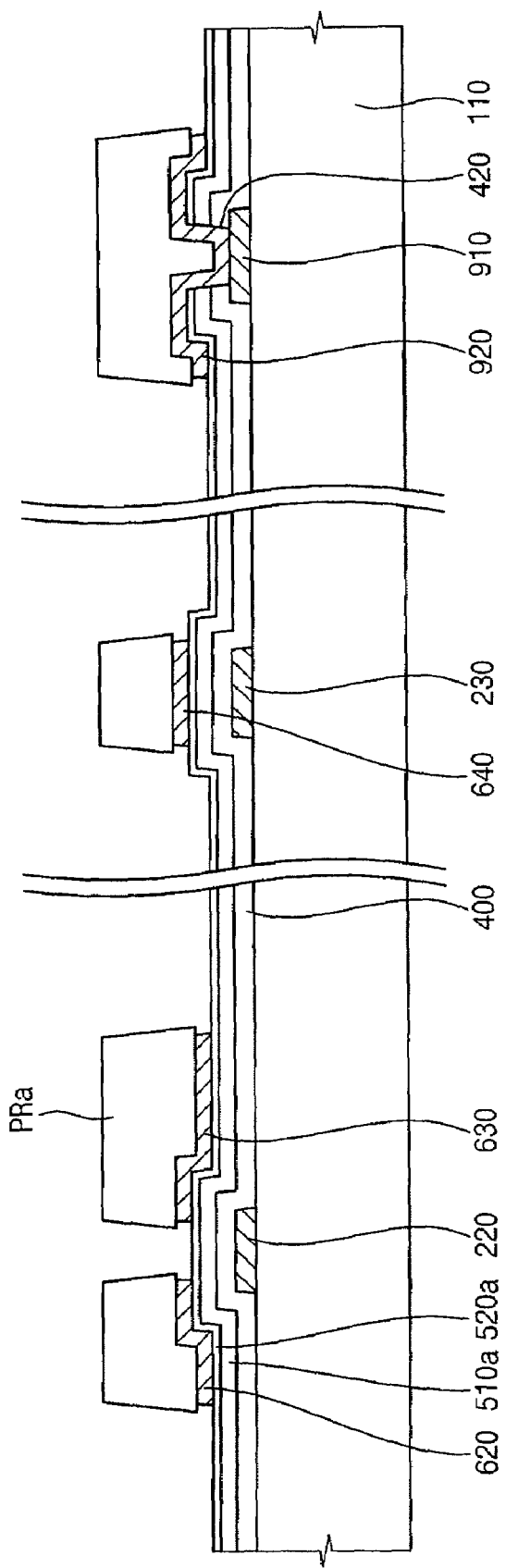

Referring to FIGS. 1, 3 and 16, the data metal layer 680 is etched to form the data wire 600 including the data line 610, the source electrode 620 and the drain electrode 630. In addition, the upper storage electrode 640 and the metal pad 920 are simultaneously formed when the data wire 600 is formed.

Figure 17:
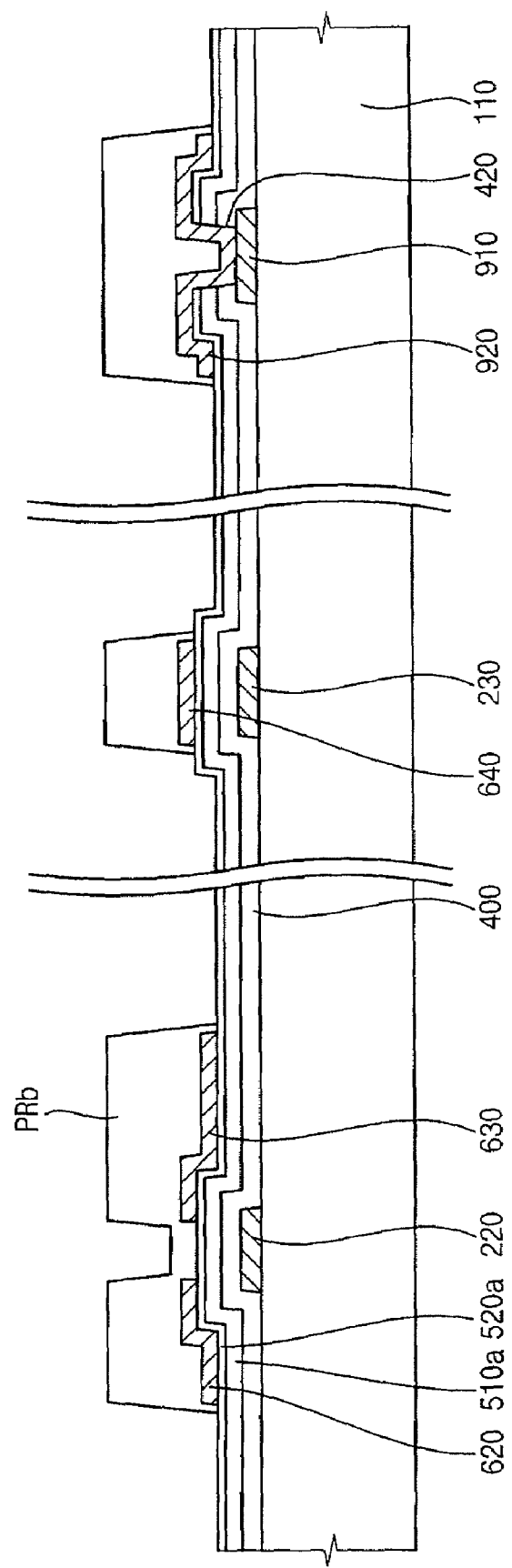

Referring to FIG. 17, the photoresist pattern PRa is reflowed forming a reflowed photoresist pattern PRb covering a channel region between the source electrode 620 and the drain electrode 630. The reflow process is performed at a temperature of more than about 140° C. in consideration of thermal reflow properties of the photoresist pattern PRa. For example, the reflow process may be performed at a temperature of about 150° C. to about 160° C.

Figure 18:
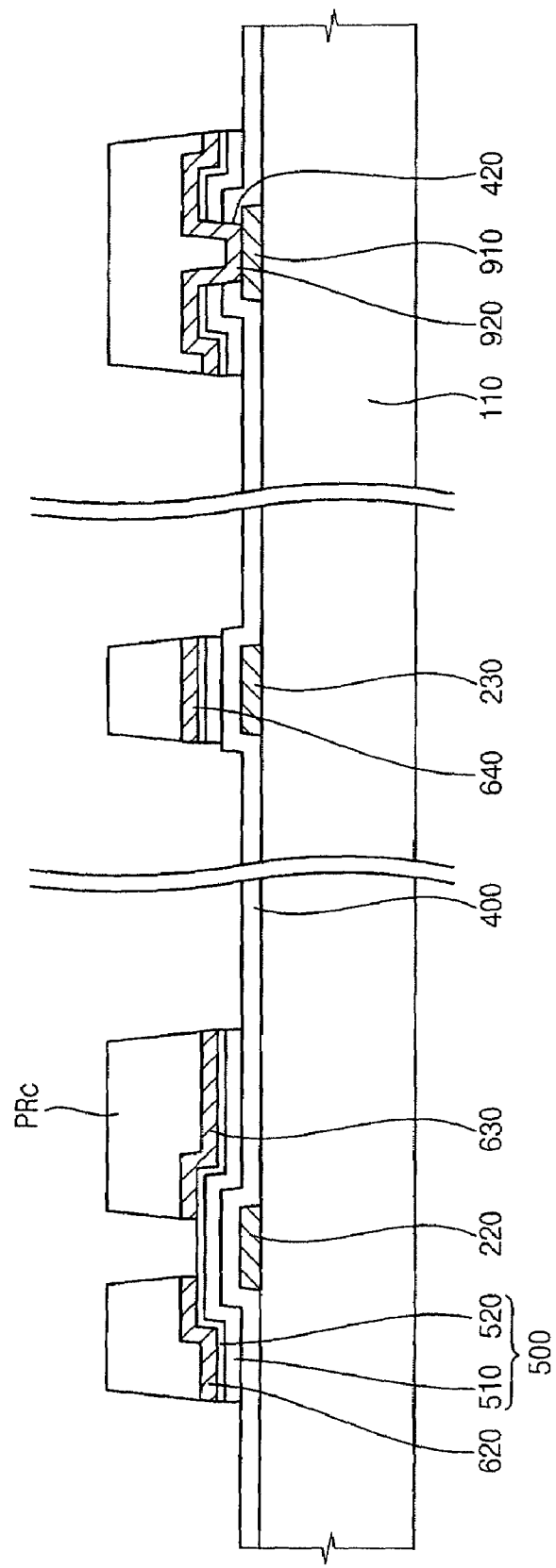

Referring to FIGS. 17 and 18, the ohmic contact layer 520a and the semiconductor layer 510a are etched to form an active pattern 500 including a ohmic contact pattern 520 and a semiconductor pattern 510. When the ohmic contact layer 520a and the semiconductor layer 510a are etched, the reflowed photoresist pattern PRb is used as an etch-stop layer.

An etch-back process that decreases a thickness of the photoresist pattern PRb by a predetermined thickness is performed forming photoresist pattern PRc. The ohmic contact layer 520a in the channel region between the source electrode 620 and the drain electrode 630 is exposed through the etch-back process.

Figure 19:
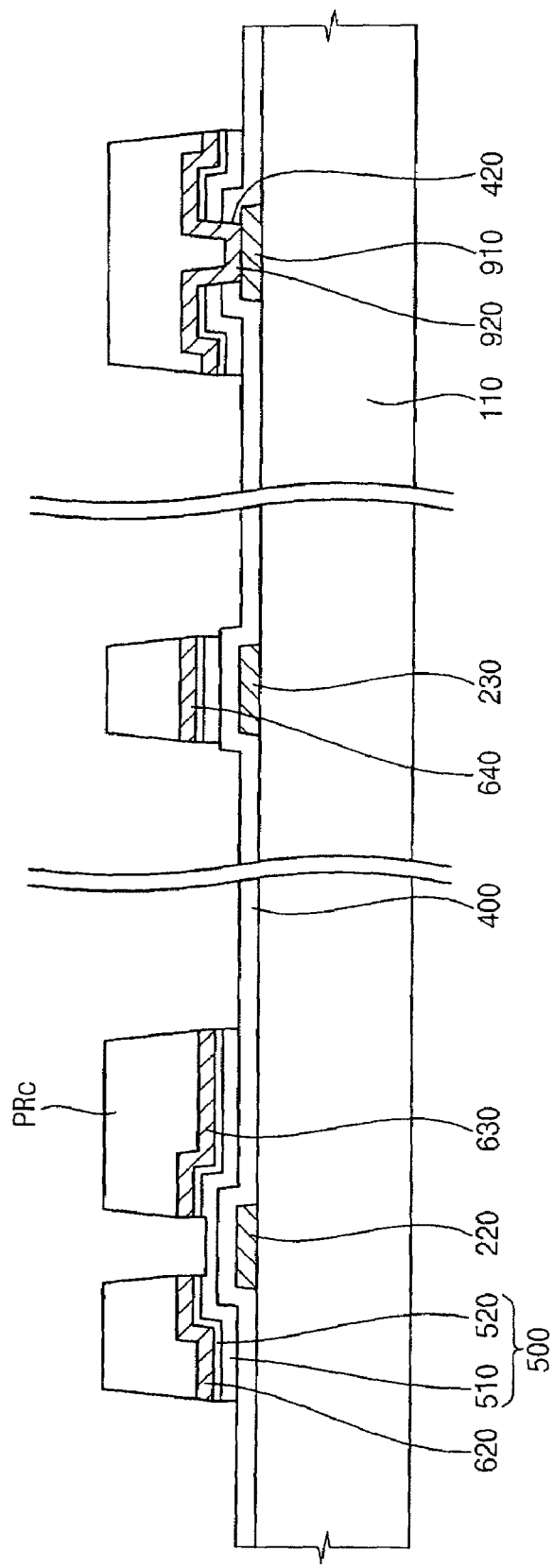

Referring to FIGS. 3 and 19, the ohmic contact layer 520a is etched to expose a portion of the semiconductor layer 520a between the source electrode 620 and the drain electrode 630. A TFT having a channel is formed. When the ohmic contact layer 520a is etched, the photoresist pattern PRc processed through the etch-back process is used as an etch-stop layer.

A portion of the photoresist pattern PRc remaining on the source electrode 620, the drain electrode 630 and the upper storage electrode 640 are stripped to complete the TFT and the storage capacitor Cst.

Figure 20:
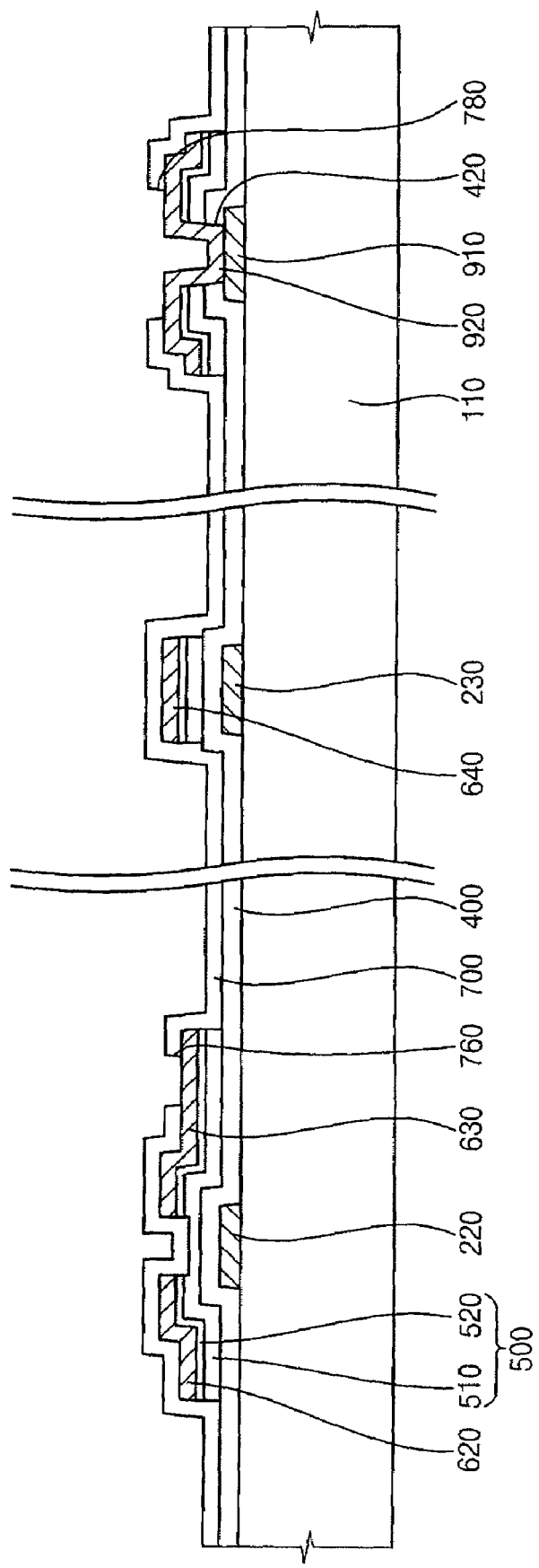

Referring to FIGS. 1, 3 and 20, an overcoat layer 700 is formed on the substrate 110 having the data wire 600 formed thereon. The overcoat layer 700 protects the data wire 600 and the data wire 600 is insulated by the overcoat layer 700. The overcoat layer 700 may include silicon nitride (SiNx).

An organic layer (not shown) may be formed on the overcoat layer to flatten the TFT substrate 100.

The overcoat layer 700 is patterned through a photo etching process to form a contact hole 760 exposing a portion of the drain electrode 630. In addition, a contact hole 780 exposing the data metal pad 920 of the pad PA may be simultaneously formed when the contact hole 760 exposing a portion of the drain electrode 603 is formed.

Referring to FIG. 3, a pixel electrode 800 is formed on the overcoat layer 700. The pixel electrode 800 is electrically connected to the drain electrode 630 through the contact hole 760 formed through the overcoat layer 700.

In addition, a pad electrode 930 may be simultaneously formed in the pad PA region when the pixel electrode 800 is formed. The pad electrode 930 is directly connected to the data metal pad 920 through the contact hole 780 formed through the overcoat layer 700.

According to a method of manufacturing the TFT, a photoresist to be reflowed at a predetermined temperature range is employed. Therefore, even though a general mask, and not a slit mask or a halftone mask, is employed, the number of processes in which masks are used may be reduced and manufacturing costs may be also reduced.

Having described exemplary embodiments of the present invention and their features, it is noted that various changes, substitutions and alterations can be made herein without departing from the spirit and scope of the invention as defined by appended claims.

What is claimed is:

1. A method of manufacturing a thin-film transistor (TFT) substrate, comprising:
    sequentially forming a gate insulation layer, a semiconductor layer, an ohmic contact layer, and a data metal layer on a substrate having a gate wire formed thereon;
    forming a photoresist pattern in a source electrode area and a drain electrode area, the photoresist pattern including a binder having a degree of dispersion of about 1.5 to about 2;
    etching the data metal layer using the photoresist pattern as a first etch-stop layer to form a data wire including a source electrode and a drain electrode;
    reflowing the photoresist pattern to cover a channel region between the source electrode and the drain electrode;
    etching the ohmic contact layer and the semiconductor layer using the reflowed photoresist pattern as a second etch-stop layer to form an active pattern including an ohmic contact pattern and a semiconductor pattern;
    etching-back the reflowed photoresist pattern to expose a portion of the ohmic contact pattern in the channel region; and
    etching the ohmic contact pattern using the etched-back photoresist pattern as a third etch-stop layer, completing the TFT having a channel.

2. The method of claim 1, wherein the photoresist pattern comprises a novolak resin or an acrylic resin.

3. The method of claim 2, wherein the photoresist pattern is reflowed at a temperature range of about 150° C. to about 160° C.

4. The method of claim 2, wherein the photoresist pattern is reflowed at a temperature range of about 150° C. to about 160° C.

5. The method of claim 1, wherein the photoresist pattern is reflowed at a temperature range of about 150° C. to about 160° C.

6. The method of claim 1, wherein the photoresist pattern is reflowed at a temperature range of about 150° C. to about 160° C.

7. The method of claim 1, further comprising:
    stripping the etched-back photoresist pattern;
    forming an overcoat layer on the substrate having the data wire formed thereon; and
    forming a pixel electrode electrically connected to the drain electrode on the overcoat layer.

8. The method of claim 7, further comprising:
    forming an organic layer on the overcoat layer.

9. The method of claim 7, further comprising:
    forming a storage capacitor.

10. The method of claim 9, wherein forming the storage capacitor comprises:
    forming a lower storage electrode, which is spaced apart from the gate wire, from a same layer as the gate wire; and
    forming an upper storage electrode, which overlaps with the lower storage electrode, from a same layer as the data wire.

11. The method of claim 9, wherein forming the storage capacitor comprises forming a lower storage electrode, which is spaced apart from the gate wire, from a same layer as the gate wire, and
    wherein the pixel electrode overlaps with the lower storage electrode to form an upper storage electrode of a TFT.

12. A method of manufacturing a TFT substrate, comprising:
    sequentially forming a gate insulation layer, a semiconductor layer and an ohmic contact layer on a substrate having a gate wire and a gate metal pad formed thereon;
    forming a contact hole passing through the gate insulation layer, the semiconductor layer and the ohmic contact layer to expose the gate metal pad;
    forming a data metal layer on the substrate having the contact hole;
    forming a photoresist pattern in a source electrode region, a drain electrode region and a pad region, the photoresist pattern including a binder having a degree of dispersion of about 1.5 to about 2;
    etching the data metal layer using the photoresist pattern as a first etch-stop layer to form a data wire including a source electrode and the drain electrode and a data metal pad directly connected to the gate metal pad;
    reflowing the photoresist pattern to cover a channel region between the source electrode and the drain electrode;
    etching the ohmic contact layer and the semiconductor layer using the reflowed photoresist pattern as a second etch-stop layer to form an active pattern including ah ohmic contact pattern and a semiconductor pattern;
    etching-back the reflowed photoresist pattern to expose a portion of the ohmic contact pattern in the channel region; and
    etching the ohmic contact pattern using the etched-back photoresist pattern as a third etch-stop layer, completing the TFT having a channel.

13. The method of claim 12, wherein the photoresist pattern comprises a novolak resin or an acrylic resin.

14. The method of claim 13, wherein reflowing the photoresist pattern is performed at a temperature range of about 150° C. to about 160° C.

15. The method of claim 13, wherein the photoresist pattern is reflowed at a temperature range of about 150° C. to about 160° C.

16. The method of claim 12, wherein the photoresist pattern is reflowed at a temperature range of about 150° C. to about 160° C.

17. The method of claim 12, wherein the photoresist pattern is reflowed at a temperature range of about 150° C. to about 160° C.

18. The method of claim 12, further comprising:
    stripping the etched-back photoresist pattern;
    forming an overcoat layer on the substrate having the data wire formed thereon; and
    forming a pixel electrode electrically connected to the drain electrode and a pad electrode connected to the data metal pad on the overcoat layer.

19. The method of claim 18, further comprising:
    forming an organic layer on the overcoat layer.

20. The method of claim 18, further comprising forming a storage capacitor by:
    forming a lower storage electrode, which is spaced apart from the gate wire, from a same layer as the gate wire; and
    forming an upper storage electrode, which overlaps with the lower storage electrode, from a same layer as the data wire.

21. The method of claim 18, further comprising forming a lower storage electrode, which is spaced apart from the gate wire, from a same layer as the gate wire to form a storage capacitor, and wherein the pixel electrode overlaps with the lower storage electrode to form an upper storage electrode.

22. A method of manufacturing a thin-film transistor (TFT) substrate, comprising:
    sequentially forming a gate insulation layer, a semiconductor layer, an ohmic contact layer, and a data metal layer on a substrate having a gate wire formed thereon;
    forming a photoresist pattern in a source electrode area and a drain electrode area the photoresist pattern including a binder having a degree of dispersion of about 1.5 to about 2;
    etching the data metal layer using the photoresist pattern as a first etch-stop layer to form a data wire including a source electrode and a drain electrode;
    reflowing the photoresist pattern to cover a channel region between the source electrode and the drain electrode;
    etching the ohmic contact layer and the semiconductor layer using the reflowed photoresist pattern as a second etch-stop layer to form an active pattern including an ohmic contact pattern and a semiconductor pattern;
    etching-back the reflowed photoresist pattern to expose a portion of the ohmic contact pattern in the channel region;
    stripping the etched-back photoresist pattern;
    forming an overcoat layer on the substrate having the data wire formed thereon; and
    forming a pixel electrode electrically connected to the drain electrode and a pad electrode connected to the data metal pad on the overcoat layer.

* * * * *